(12) United States Patent
Du et al.

(10) Patent No.: US 10,645,799 B2
(45) Date of Patent: *May 5, 2020

(54) HIGH-FREQUENCY AND HIGH-TRANSMISSION SPEED FPC WITH FRCC AND PREPARATION METHOD THEREOF

(71) Applicant: Kunshan Aplus Tec. Corporation, Kunshan (CN)

(72) Inventors: Bo-sian Du, Kunshan (CN); Chihming Lin, Kunshan (CN); Chienhui Lee, Kunshan (CN)

(73) Assignee: KUNSHAN APLUS TEC. CORPORATION, Kunshan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/118,454

(22) Filed: Aug. 31, 2018

(65) Prior Publication Data

US 2019/0215947 A1    Jul. 11, 2019

(30) Foreign Application Priority Data

Jan. 8, 2018  (CN) .......................... 2018 1 0013339

(51) Int. Cl.
| | |
|---|---|
| *B21C 37/00* | (2006.01) |
| *H05K 1/02* | (2006.01) |
| *H05K 1/03* | (2006.01) |
| *H05K 3/46* | (2006.01) |

(Continued)

(52) U.S. Cl.
CPC ............. *H05K 1/024* (2013.01); *H05K 1/028* (2013.01); *H05K 1/0353* (2013.01); *H05K 1/09* (2013.01); *H05K 3/4635* (2013.01); *H05K 3/4688* (2013.01); *B32B 15/08* (2013.01); *H05K 1/0242* (2013.01); *H05K 1/0393* (2013.01);

(Continued)

(58) Field of Classification Search
None
See application file for complete search history.

(56) References Cited

U.S. PATENT DOCUMENTS

| | | | | |
|---|---|---|---|---|
| 7,115,681 | B2 * | 10/2006 | Shimo-Ohsako | ...... C08G 59/08 524/538 |
| 2005/0119381 | A1 * | 6/2005 | Tanaka | ............... C08G 59/4014 524/196 |

(Continued)

*Primary Examiner* — Seth Dumbris
(74) *Attorney, Agent, or Firm* — Bayramoglu Law Offices LLC

(57) ABSTRACT

A high-frequency and high-transmission speed FPC with FRCC. The FPC includes FRCC and a double-sided board laminated again each other. The FRCC includes a third copper foil layer, a second ultra-low dielectric adhesive layer and a second insulating layer located between the third copper foil layer and the second ultra-low dielectric adhesive layer. One surface of the third copper foil layer is an inner surface. The double-sided board includes a first copper foil layer, a second copper foil layer and a first insulating layer located between the first copper foil layer and the second copper foil layer. An inner surface of the first copper foil layer has an Rz value of 0.05-0.5 µm. An inner surface of the second copper foil layer has an Rz value of 0.1-1.10 µm. The FPC has a good electrical property, a simple structure, a cost advantage, a brief preparation process, and a low thermal expansion coefficient.

9 Claims, 3 Drawing Sheets

(51) Int. Cl.
*H05K 1/09* (2006.01)
*B32B 15/08* (2006.01)
(52) U.S. Cl.
CPC .............. *H05K 2201/0141* (2013.01); *H05K 2201/0154* (2013.01); *Y10T 428/12438* (2015.01)

(56) References Cited

U.S. PATENT DOCUMENTS

| 2018/0022976 A1* | 1/2018 | Du | C09J 11/04 523/400 |
| 2018/0242448 A1* | 8/2018 | Yoshikawa | B32B 7/12 |

* cited by examiner

HIGH-FREQUENCY AND HIGH-TRANSMISSION SPEED FPC WITH FRCC AND PREPARATION METHOD THEREOF

CROSS REFERENCE TO RELATED APPLICATIONS

This application is based upon and claims priority to Chinese Patent Application No. 201810013339.3, filed on Jan. 8, 2018, the entire content of which is incorporated herein by reference.

TECHNICAL FIELD

The invention relates to the technical field of flexible printed circuits (FPCs), in particular to a high-frequency and high-transmission speed FPC with flexible resin coated copper (FRCC) and a preparation method thereof.

BACKGROUND

With the rapid development of information technology, various hybrid multilayer boards are increasingly being designed and applied to realize high-frequency and high-speed signal transmission and rapid heat dissipation and conduction and to minimize the production cost. As indispensable materials of electronic products, more and more printed circuit boards (PCBs) are needed along with the increasing requirement for consumer electronic products. With the characteristics of flexibility and wire configuration in a three-dimensional space, FPCs are nowadays widely applied to computers, peripheral equipment of the computers, communication products, consumer electronic products, and the like, under the development tendency emphasizing light, thin, small, flexible and high-frequency technological electronic products.

In the high-frequency field, the insertion loss of wireless infrastructure needs to be as low as possible to effectively increase the energy utilization rate. Along with the requirement for 5G communication, millimeter-waves, high-frequency and high-speed accelerator FPCs/PCBs in the aviation and military industry, the rising of emerging industries such as big data and Internet of Things, and the popularization of mobile internet terminals, rapid information processing and transmission have become the focus of the communication industry. In the communication field, further 5G networks will have a higher-speed bandwidth, denser base station construction and a higher network speed than existing 4G networks. To meet the requirement for the Internet of Things, cloud computation and various new-generation broadband communications, high-speed servers and mobile phones with higher transmission speeds have become the development tendency on the market. Generally, FPCs/PCBs are the main bottleneck of the whole transmission process, and the lack of favorable designs and relevant materials with good electrical properties will severely affect the transmission speed or result in signal losses. To overcome the bottleneck, high requirements are put forward for materials of PCBs. Moreover, high-frequency boards mainly used in this industry at present are liquid crystal polymer (LCP) boards and polytetrafluoroethylene (PTFE) fiber boards, but these boards are also limited by the manufacturing process, which has a high requirement for equipment and has to be operated in a high-temperature environment (>280° C.), accordingly, causing a non-uniform film thickness which in turn results in difficult control over the resistance value of the circuit boards. In addition, LCP or PTFE may be squeezed in the high-temperature lamination process, which affects the conductivity of plated copper and causes open circuits, thus, resulting in low confidence and reducing reliability. Moreover, due to the fact that a quick press cannot be used, processing is difficult. Besides, in the high-temperature SMT process or other FPC processes such as the bending process and the strong-acid or strong-alkali liquor preparation process, the yield can be decreased due to poor peel strength. Although other resin films do not have such problems, these resin films have the problems of poor electrical properties or poor mechanical strength.

SUMMARY

The main influence factors which are of great importance for signal integrity during high-frequency and high-speed transmission are the base materials of copper foil layers and insulating layers. As the raw material of FPCs/PCBs, FRCC is mainly formed by a plurality of insulating layers and copper foil layers. The performance of the FRCC, to a large extent, depends on the selection of low-Dk/Df resin layers as well as the selection of the surface roughness and lattice arrangement of copper foil.

To solve the above-mentioned technical problems, the invention provides a high-frequency and high-transmission speed FPC with FRCC and a preparation method thereof. The FPC prepared through the method has a good electrical property, is provided with low-roughness copper foil layers, and has a simple structure, a cost advantage, a brief preparation process, a low thermal expansion coefficient, stable Dk/Df performance in high-temperature and high-humidity environments, an ultra-low water absorption, a good UV laser drilling capacity, a low rebound suitable for high-density assembly, and an excellent mechanical property. In addition, through existing casting methods, only a thickness to the maximum of about 50 μm can be obtained, however, by adoption of the preparation method of the invention, a film thickness over 100 μm can be easily obtained.

One technical scheme adopted by the invention to solve the above-mentioned technical problems is to provide a high-frequency and high-transmission speed FPC with FRCC. The FPC comprises FRCC and a double-sided board. The FRCC and the double-sided board are laminated against each other.

The FRCC comprises a third copper layer, a second ultra-low dielectric adhesive layer and a second insulating layer located between the third copper layer and the second ultra-low dielectric adhesive layer. The second insulating layer is at least one selected from a second polyimide layer and a second LCP resin layer. A surface, in contact with the second insulting layer or the second ultra-low dielectric adhesive layer, of the third copper foil layer is an inner surface. The inner surface of the third copper foil layer has an Rz value of 0.1-1.0 μm.

The third copper foil layer, the second ultra-low dielectric adhesive layer and the second insulating layer have a total thickness of 8-185 μm, wherein the third copper foil layer has a thickness of 1-35 μm, the second ultra-low dielectric adhesive layer has a thickness of 2-50 μm, the second polyimide layer has a thickness of 5-50 μm, and the second LCP resin layer has a thickness of 5-100 μm.

The second ultra-low dielectric adhesive layer has a Dk value of 2.0-3.5 and a Df value of 0.002-0.010.

The double-sided board comprises a first copper foil layer, a second copper foil layer and a first insulating layer located between the first copper foil layer and the second copper foil layer. A surface, close to the first insulating layer, of the first copper foil layer is an inner surface. A surface, close to the first insulating layer, of the second copper foil layer is an inner surface. The inner surface of the first copper foil layer has an Rz value of 0.05-0.5 μm. The inner surface of the second copper foil layer has an Rz value of 0.1-1.10 μm.

Furthermore, a laminated structure formed by the third copper foil layer, the second ultra-low dielectric adhesive layer and the second insulating layer has an overall water absorption of 0.01-1.5%.

Furthermore, the third copper foil layer, the first copper foil layer and the second copper foil layer are all rolled copper foil layers or electrolytic copper foil layers.

Furthermore, the second LCP resin layer has a Dk value of 2.0-3.5 and a Df value of 0.002-0.005.

Furthermore, the peel strength between the second ultra-low dielectric adhesive layer and the third copper foil layer and the peel strength between the second ultra-low dielectric adhesive layer and the second insulating layer are both over 0.7 kgf/cm.

Furthermore, the resin material of the second ultra-low dielectric adhesive layer is at least one selected from fluororesin, epoxy resin, acrylic resin, carbamate resin, silicone resin, poly-p-xylene resin, bismaleimide resin and polyimide resin.

Furthermore, the second ultra-low dielectric adhesive layer is a thermoset polyimide layer containing polyimide, and the content of the polyimide accounts for 40-95% of the total solid content of the second ultra-low dielectric adhesive layer.

Furthermore, the FRCC adopts one of the following three structures:

Structure 1: The second insulating layer is a second polyimide layer, two second ultra-low dielectric adhesive layers are included and are respectively a second upper ultra-low dielectric adhesive layer and a second lower ultra-low dielectric adhesive layer, the second polyimide layer is located on the upper surface of the second lower ultra-low dielectric adhesive layer, the second upper ultra-low dielectric adhesive layer is located on the upper surface of the second polyimide layer, and the third copper foil layer is located on the upper surface of the second upper ultra-low dielectric adhesive layer;

The third copper foil layer, the second upper ultra-low dielectric adhesive layer, the second polyimide layer and the second lower ultra-low dielectric adhesive layer have a total thickness of 10-185 μm.

Structure 2: The second insulating layer is a second polyimide layer located on the upper surface of the second ultra-low dielectric adhesive layer, and the third copper foil layer is located on the upper surface of the second polyimide layer;

The third copper foil layer, the second polyimide layer and the second ultra-low dielectric adhesive layer have a total thickness of 8-135 μm.

Structure 3: The second insulating layer is a second LCP resin layer, the third copper foil layer is located on the upper surface of the second LCP resin layer, and the second ultra-low dielectric adhesive layer is located on the lower surface of the second LCP resin layer.

Furthermore, the FPC adopts one of the following six structures with the FRCC laminated against the double-sided board:

Structure 1: The FRCC sequentially comprises, from top to bottom, the third copper foil layer, the second upper ultra-low dielectric adhesive layer, the second polyimide layer and the second lower ultra-low dielectric adhesive layer; the double-sided board further comprises first ultra-low dielectric adhesive layers, which are respectively a first upper ultra-low dielectric adhesive layer and a first lower ultra-low dielectric adhesive layer; the first insulating layer is a first polyimide layer; and the first copper foil layer, the first upper ultra-low dielectric adhesive layer, the first polyimide layer, the first lower ultra-low dielectric adhesive layer and the second copper foil layer of the double-sided board are sequentially arranged from top to bottom.

Structure 2: The FRCC sequentially comprises, from top to bottom, the third copper foil layer, the second upper ultra-low dielectric adhesive layer, the second polyimide layer and the second lower ultra-low dielectric adhesive layer; the first insulating layer is a first LCP resin layer; and the first copper foil layer, the first LCP resin layer and the second copper foil layer of the double-sided board are sequentially arranged from top to bottom.

Structure 3: The FRCC sequentially comprises, from top to bottom, the third copper foil layer, the second polyimide layer and the second ultra-low dielectric adhesive layer; the double-sided board further comprises first ultra-low dielectric adhesive layer, which are a first upper ultra-low dielectric adhesive layer and a first lower ultra-low adhesive layer; the first insulating layer is a first polyimide layer; and the first copper foil layer, the first upper ultra-low dielectric adhesive layer, the first polyimide layer, the first lower ultra-low dielectric adhesive layer and the second copper foil layer of the double-sided board are sequentially arranged from top to bottom.

Structure 4: The FRCC sequentially comprises, from top to bottom, the third copper foil layer, the second polyimide layer and the second ultra-low dielectric adhesive layer; the first insulating layer is a first LCP resin layer; and the first copper foil layer, the first LCP resin layer and the second copper foil layer of the double-sided board are sequentially arranged from top to bottom.

Structure 5: The FRCC sequentially comprises, from top to bottom, the third copper foil layer, the second LCP resin layer and the second ultra-low dielectric adhesive layer; the first insulating layer is a first LCP resin layer; and the first copper foil layer, the first LCP resin layer and the second copper foil layer of the double-sided board are sequentially arranged from top to bottom.

Structure 6: The FRCC sequentially comprises, from top to bottom, the third copper foil layer, the second LCP resin layer and the second ultra-low dielectric adhesive layer; the double-sided board further comprises first ultra-low dielectric adhesive layers, which are respectively a first upper ultra-low dielectric adhesive layer and a first lower ultra-low dielectric adhesive layer; the first insulating layer is a first polyimide layer; and the first copper foil layer, the first upper ultra-low dielectric adhesive layer, the first polyimide layer, the first lower ultra-low dielectric adhesive layer and the second copper foil layer of the double-sided board are sequentially arranged from top to bottom.

The invention further provides a preparation method of the high-frequency and high-transmission speed FPC with the FRCC. The preparation method comprises the following step: the FRCC and the double-sided board are pre-pressed, laminated and cured, wherein the pre-pressing time is 10-30 s, the lamination time is 120-180 s, the lamination pressure is 90-110 kgf/cm$^2$, the temperature of lamination is 185±10, the curing temperature is 165-175° C., and the curing time is 50-70 min.

The invention has the beneficial effect that the FPC is provided with three copper foil layers which are respectively the first, second and third copper layers and thus has a reasonable structure. Thus, the invention at least has the following advantages:

1. The FPC is formed by the FRCC and the double-sided board laminated against each other, and is provided with three copper foil layers, wherein as outer copper foil layers needing to be soldered at a high temperature (about 260'C) and used to carry elements, the third copper foil layer and the second copper foil layer are required to have a high peel strength (over 0.7 kgf/cm); while as an inner copper foil layer located in the middle, the first copper foil layer also called a signal line copper foil layer and mainly used to close circuits does not need to be subjected to a SMT process or other high-temperature preparation processes and does not need to carry elements either, and thus the requirement for the peel strength of the first copper foil layer and the second ultra-low dielectric adhesive layer is low (just over 0.5 kgf/cm). The traditional view has always been that it is better to keep the peel strength between copper foil layers and other layers in FPCs greater (at least over 0.7 kgf/cm) within a certain range so as to prevent the layers from being separated from one another or falling; to obtain a greater peel strength, the copper foil layers need to have a greater Rz value; however, under the skin effect generated in the signal transmission process of the copper foil layers, the Rz value is required to be smaller to realize a high frequency and high transmission speed, and thus, there is a contradiction between the requirement for the great peel strength and the requirement for the high frequency and high transmission speed. As for the FPC of the invention, due to the fact that the first copper foil layer does not need to be subjected to the SMT process or other high-temperature preparation processes and does not need to carry elements either, the requirement for the peel strength of the first copper foil layer and the second ultra-low dielectric adhesive layers is low and is only over 0.5 kgf/cm, and thus, the first copper foil layer can have a smaller Rz value, a better electrical property and a lower insertion loss without affecting the high-frequency and high-transmission speed performance of the FPC.

2. The third copper foil layer, the first copper foil layer and the second copper foil layer have a small Rz value, and thus, the skin effect can be generated in the signal transmission process; due to the low surface roughness, fine and smooth crystallization and good surface smoothness of copper foil, high-speed transmission of signals can be achieved; and meanwhile, because the ultra-low dielectric adhesive layers have low and stable Dk/Df performance, the loss generated in the signal transmission process can be reduced, and the signal transmission quality is further improved, thus, completely meeting the development requirements for high frequency, high speed, rapid heat dissipation and conduction, and minimum production cost of FPCs.

3. The second ultra-low dielectric adhesive layer has a Dk value of 2.0-3.5 and a Df value of 0.002-0.010 and has a low and stable Dk/Df value in high-temperature and high-humidity environments, so that the FRCC and the double-sided board are suitable for being quickly lamination at a low temperature (below 180° C.) to prepare the FPC; the processability is good, the requirement for preparation equipment is low, and thus, the production cost is reduced; the equipment operability and machinability of the FPC are superior to those of existing LCP substrates and PTFE fiber boards; and more preferably, because the FRCC and the double-sided board are suitable for being lamination at a low temperature, the risk of circuit oxidization in the FPC preparation process is greatly lowered;

4. The second ultra-low dielectric adhesive layer can be a thermoset polyimide layer containing polyimide, the content of the polyimide accounts for 40-95% of the total solid content of the second ultra-low dielectric adhesive layer, and compared with traditional epoxy resin products, the FRCC of the invention is more suitable for small-aperture (<100 μm) UV laser processing of the downstream industry through the cooperative structure of the thermoset polyimide layer and the second insulating layer, shrinkage of plating through holes (PTHs) or holes is unlikely to be caused, the film thickness is uniform in the lamination process, impedance control is good, and the FRCC is not only suitable for a large-aperture mechanical drilling method and thus has good technological adaptability.

5. Compared with common LCP boards, the FRCC of the invention has a low rebound which is only about half that of the LCP boards, and thus is suitable for the downstream high-density assembly process.

6. The FRCC can be provided with a second polyimide layer, and according to the formula, the second ultra-low dielectric adhesive layer can contain polyimide, so that the overall water absorption of FPC is kept 0.01-1.5%; thanks to the ultra-low water absorption, the FPC has stable performance after absorbing water and also has an excellent electrical property, the risk of delamination caused when multi-layer boards are combined with soft/hard boards can be greatly lowered, and the insertion loss of signal transmission is decreased.

7. The FPC of the invention also has the advantages of excellent thermal expansibility, good flexibility, high soldering resistance and a very good mechanical property, and the ultra-low dielectric adhesive layer has a good peel strength over 0.7 kgf/cm.

8. As for existing coated LCP substrates, only a thickness of 12.5 μm can be obtained by each time of casting, and thus, casting has to be conducted four times to prepare an LCP substrate with a thickness of 50 μm; besides, to prepare an LCP double-sided board, a copper foil layer has to be laminated against the other side, and thus, the procedures are complex, and the efficiency is low. The FRCC of the invention is of a three structure containing polyimide layer, which can be obtained through one time of casting, and thus, the FPC adopting such structure can be prepared through simple procedures and has a cost advantage.

9. When existing Bond Ply products are applied to the downstream industry, a release layer needs to be stripped first, and then an upper copper foil layer is laminated; however, this FRCC structure is simple in configuration, and downstream processing procedures can be simplified; and the cost is relatively low.

The above description of the invention is only used for summarizing the technical scheme of the invention. For a better understanding of the technical means of the invention, implementations can be performed based on the contents of the specification. A detailed description is given as follows in combination with preferred embodiments and drawings of the invention.

REFERENCE SIGNS OF COMPONENTS IN FIGURES

Figure 1:
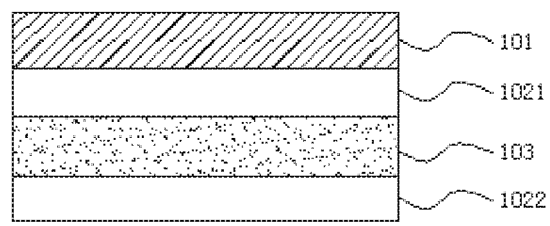
FIG. 1 is a structural view of embodiment 1 of the invention.

FRCC 100, third copper foil layer 101, second ultra-low dielectric adhesive layer 102, second upper ultra-low dielectric adhesive layer 1021, second lower ultra-low dielectric adhesive layer 1022, second polyimide layer 103, second LCP resin layer 104, double-sided board 200, first copper foil layer 201, second copper foil layer 202, first upper ultra-low dielectric adhesive layer 203, first lower ultra-low dielectric adhesive layer 206, first polyimide layer 204, first LCP resin layer 205.

DETAILED DESCRIPTION

Specific implementations of the invention are explained as follows in combination with specific embodiments. Those skilled in this field can easily understand the advantages and effects of the invention based on the contents in this specification. The invention can also be implemented in other different manners, which means that different modifications and alterations can be made within the scope of the invention.

The terms "first" and "second" in this specification are solely used for a distinguishing purpose and by no means limit the protection scope of the invention.

The invention provides a high-frequency and high-transmission speed FPC with FRCC. The FPC comprises FRCC 100 and a double-sided board 200, wherein the FRCC and the double-sided board are laminated against each other.

The FRCC comprises a third copper foil layer 101 and a second ultra-low dielectric adhesive layer 102, and a second insulating layer located between the third copper foil layer 101 and the second ultra-low dielectric adhesive layer 102. The second insulating layer is at least one selected from a second polyimide layer 103 and a second LCP resin layer 104. A surface, in contact with the second insulating layer or the second ultra-low dielectric adhesive layer, of the third copper foil layer is an inner surface. The inner surface of the third copper foil layer has an Rz value of 0.1-1.0 μm.

The third copper foil layer, the second ultra-low dielectric adhesive layer and the second insulating layer have a total thickness of 8-185 μm, wherein the third copper foil layer has a thickness of 1-35 μm, the second ultra-low dielectric adhesive layer has a thickness of 2-50 μm, the second polyimide layer has a thickness of 5-50 μm, and the second LCP resin layer has a thickness of 5-100 μm.

The second ultra-low dielectric adhesive layer has a Dk (dielectric constant) value of 2.0-3.5 (10 GHz) and a Df (dielectric dissipation factor) value of 0.002-0.010 (10 GHz).

The double-sided board comprises a first copper foil layer 201, a second copper foil layer 202 and a first insulting layer located between the first copper foil layer and the second copper foil layer. A surface, close to the first insulating layer, of the first copper foil layer is an inner surface. A surface, close to the first insulating layer, of the second copper foil layer is an inner surface. The inner surface of the first copper foil layer has an Rz value of 0.05-0.5 μm. The inner surface of the second copper foil layer has an Rz value of 0.1-1.10 μm.

The inner surface of the third copper foil layer has an Rz value, for instance, of 0.1 μm, 0.2 μm, 0.3 μm, 0.4 μm, 0.5 μm, 0.6 μm, 0.7 μm, 0.8 μm, 0.9 μm or 1.0 μm.

The inner surface of the first copper foil layer has an Rz value, for instance, of 0.05 μm, 0.08 μm, 0.1 μm, 0.21 μm, 0.3 μm, 0.4 μm or 0.5 μm.

The inner surface of the second copper foil layer has an Rz value, for instance, of 0.1 μm, 0.2 μm, 0.3 μm, 0.4 μm, 0.5 μm, 0.6 μm, 0.7 μm, 0.8 μm, 0.9 μm, 1.0 μm or 1.10 μm.

A laminated structure formed by the third copper foil layer, the second ultra-low dielectric adhesive layer and the second insulating layer has an overall water absorption of 0.01-1.5%.

The third copper foil layer, the first copper foil layer and the second copper foil layer are all rolled copper foil layers (RA/HA/HAV2) or electrolytic copper foil layers (ED).

Implementation 1: As for the FRCC shown in FIG. 1, the second insulating layer is a second polyimide layer 103, two second ultra-low dielectric adhesive layers are included and are respectively a second upper ultra-low dielectric adhesive layer 1021 and a second lower ultra-low dielectric adhesive layer 1022, the second polyimide layer is located on the upper surface of the second lower ultra-low dielectric adhesive layer, the second upper ultra-low dielectric adhesive layer is located on the upper surface of the second polyimide layer, and the third copper foil layer 101 is located on the upper surface of the second upper ultra-low dielectric adhesive layer.

The third copper foil layer, the second upper ultra-low dielectric adhesive layer, the second polyimide layer and the second lower ultra-low dielectric adhesive layer have a total thickness of 10-185 μm.

The peel strength between the second upper ultra-low dielectric adhesive layers and the third copper foil layer and the peel strength between the second lower ultra-low dielectric adhesive layer and the second insulating layer are both over 0.7 kgf/cm.

The resin material of the second ultra-low dielectric adhesive layers is at least one selected from fluororesin, epoxy resin, acrylic resin, carbamate resin, silicone resin, poly-p-xylene resin, bismaleimide resin and polyimide resin.

The second ultra-low dielectric adhesive layers are thermoset polyimide layers containing polyimide, and the content of the polyimide accounts for 40-95% of the total solid content of the second ultra-low dielectric adhesive layers.

In this implementation, the third copper foil layer preferably has a thickness of 6-18 μm.

The second polyimide layer has a thickness of 5-12.5 μm.

The second LCP resin layer has a thickness of 12.5-50 μm.

The second ultra-low dielectric adhesive layers have a thickness of 10-50 μm.

The FRCC further comprises a release layer formed on the lower surface of the second lower ultra-low dielectric adhesive layer. The release layer is a release film or a piece of release paper. The release film is made from at least one selected from polypropylene, biaxially oriented polypropylene and polyethylene terephthalate.

In this implementation, the preparation method of the FRCC comprises the following steps:

Step 1, the second upper ultra-low dielectric adhesive layer is casting on one side of the second polyimide layer and then is dried and laminated;

Step 2, the third copper foil layer is laminated against the upper surface of the second upper ultra-low dielectric adhesive layer;

Step 3, the second lower ultra-low dielectric adhesive layer is casting on the other side of the second polyimide layer and then is dried and laminated; and Step 4, the release layer is laminated against the lower surface of the second lower ultra-low dielectric adhesive layer.

According to the preparation method of the FRCC, the pre-pressing time is 10-20 s, the lamination time is 60-120 s, the lamination pressure is 90-110 kgf/cm$^2$ the lamination temperature is 185±+10° C., the curing temperature is 165-175° C., and the curing time is 50-60 min.

Preferably, the lamination pressure is 100 kgf/cm$^2$, the curing temperature is 170° C., and the curing time is 60 min.

Figure 2:
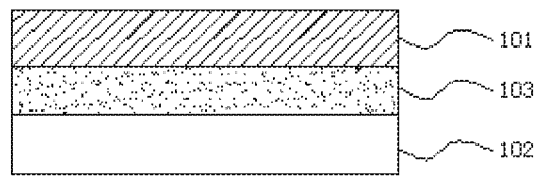
FIG. 2 is a structural view of embodiment 2 of the invention.

Implementation 2: As shown in FIG. 2, the FRCC in this implementation is structurally similar to the FRCC in implementation 1 and differs from the FRCC in implementation 1 in the following aspects: the second insulating layer is a second polyimide layer 103 located on the upper surface of the second ultra-low dielectric adhesive layer 102, and the third copper foil layer 101 is located on the upper surface of the second polyimide layer 103.

The third copper foil layer, the second polyimide layer and the second ultra-low dielectric adhesive layer have a total thickness of 8-135 µm.

In this implementation, the preparation method of the FRCC comprises the following steps:

Step 1, the second polyimide layer is casting on one side of the third copper foil layer and then is cured and laminated;

Step 2, the second ultra-low dielectric adhesive layer is casting on the other side of the second polyimide layer and then is dried and laminated; and Step 3, the release layer is laminated against the lower surface of the second ultra-low dielectric adhesive layer.

Figure 3:
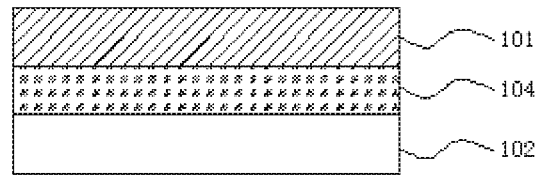
FIG. 3 is a structural view of embodiment 3 of the invention.

Implementation 3: As shown in FIG. 3, the FRCC in this implementation is structurally similar to the FRCC in implementation 1 and differs from the FRCC in implementation 1 in the following aspects: the second insulating layer is a second LCP resin layer 104, the third copper foil layer 101 is located on the upper surface of the second LCP resin layer, and the second ultra-low dielectric adhesive layer 102 is located on the lower surface of the second LCP resin layer.

The second LCP resin layer has a Dk value of 2.0-3.5(10 GHz) and a Df value of 0.002-0.005(10 GHz).

In this implementation, the preparation method of the FRCC comprises the following steps:

Step 1, the second LCP resin layer is casting on or laminated against one side of the third copper foil layer and then is dried and laminated;

Step 2, the second ultra-low dielectric adhesive layer is casting on the other side of the second LCP resin layer and then is dried and laminated, and Step 3, the release layer is laminated against the lower surface of the second ultra-low dielectric adhesive layer.

Figure 4:
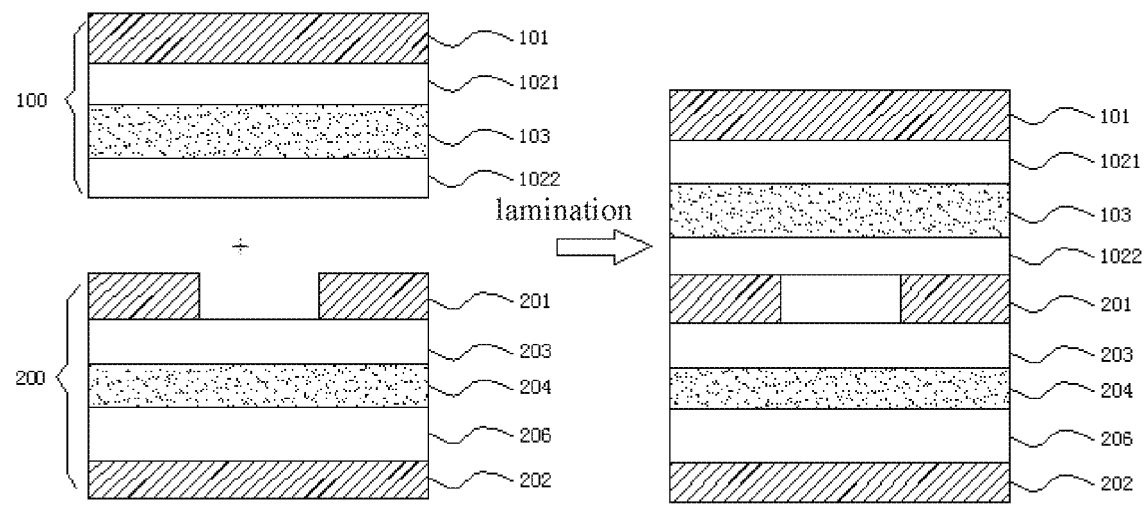
FIG. 4 is a structural view of embodiment 4 of the invention.

Implementation 4: As for the high-frequency and high-transmission speed FPC with the FRCC, the FRCC is laminated against the double-sided board, as shown in FIG. 4. The FRCC sequentially comprises, from top to bottom, the third copper foil layer 101, the second upper ultra-low dielectric adhesive layer 1021, the second polyimide layer 103 and the second lower ultra-low dielectric adhesive layer 1022. The double-sided board further comprises first ultra-low dielectric adhesive layers, which are respectively a first upper ultra-low dielectric adhesive layer 203 and a first lower ultra-low dielectric adhesive layer 206. The first insulating layer is a first polyimide layer 204. The first copper foil layer 201, the first upper ultra-low dielectric adhesive layer 203, the first polyimide layer 204, the first lower ultra-low dielectric adhesive layer 206 and the second copper foil layer 202 of the double-sided board are sequentially arranged from top to bottom.

Figure 5:
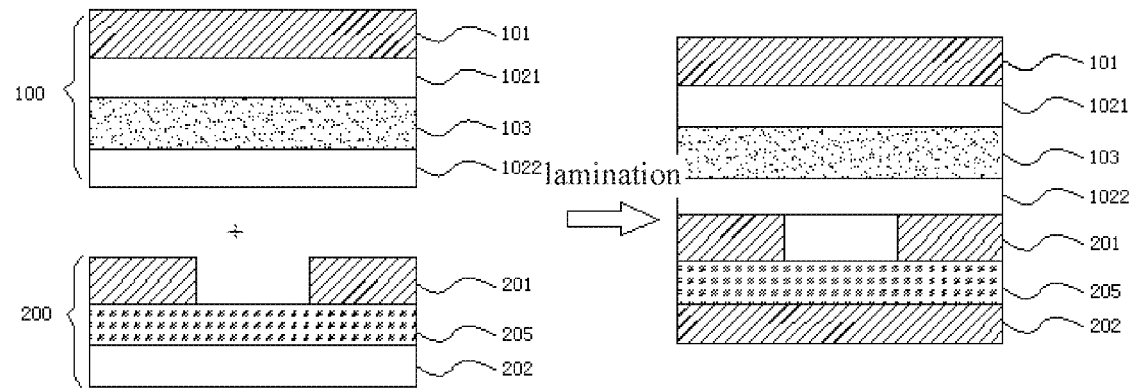
FIG. 5 is a structural view of embodiment 5 of the invention.

Implementation 5: As for the high-frequency and high-transmission speed FPC with the FRCC, the FRCC is laminated against the double-sided board, as shown in FIG. 5. The FRCC sequentially comprises, from top to bottom, the third copper foil layer 101, the second upper ultra-low dielectric adhesive layer 1021, the second polyimide layer 103 and the second lower ultra-low dielectric adhesive layer 1022. The first insulating layer is a first LCP resin layer 205. The first copper foil layer 201, the first LCP resin layer 205 and the second copper foil layer 202 of the double-sided board are sequentially arranged from top to bottom.

Figure 6:
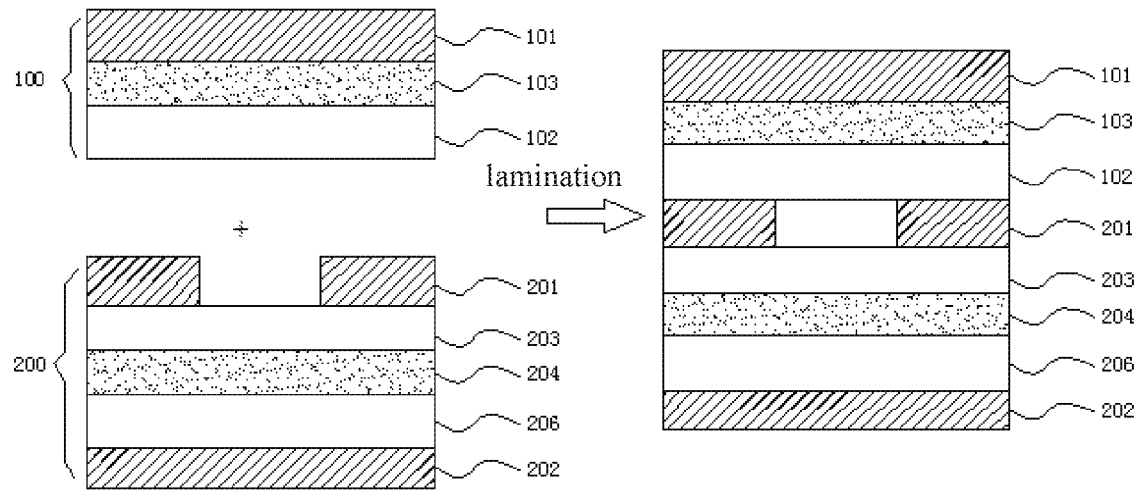
FIG. 6 is a structural view of embodiment 6 of the invention.

Implementation 6: As for the high-frequency and high-transmission speed FPC with the FRCC, the FRCC is laminated against the double-sided board, as shown in FIG. 6. The FRCC sequentially comprises, from top to bottom, the third copper foil layer 101, the second polyimide layer 103 and the second ultra-low dielectric adhesive layer 102. The double-sided board further comprises first ultra-low dielectric adhesive layers, which are respectively a first upper ultra-low dielectric adhesive layer and a first lower ultra-low dielectric adhesive layer. The first insulating layer is a first polyimide layer. The first copper foil layer 201, the first upper ultra-low dielectric adhesive layer 203, the first polyimide layer 204, the first lower ultra-low dielectric adhesive layer 206 and the second copper foil layer 202 of the double-sided board are sequentially arranged from top to bottom.

Figure 7:
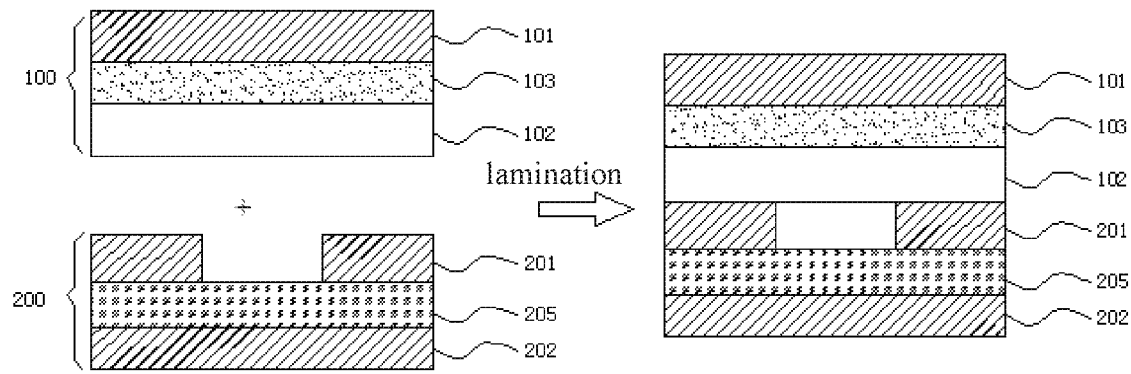
FIG. 7 is a structural view of embodiment 7 of the invention.

Implementation 7: As for the high-frequency and high-transmission speed FPC with the FRCC, the FRCC is laminated against the double-sided board, as shown in FIG. 7. The FRCC sequentially comprises, from top to bottom, the third copper foil layer 101, the second polyimide layer 103 and the second ultra-low dielectric adhesive layer 102. The first insulating layer is a first LCP resin layer. The first copper foil layer 201, the first LCP resin layer 205 and the second copper foil layer 202 of the double-sided board are sequentially arranged from top to bottom.

Figure 8:
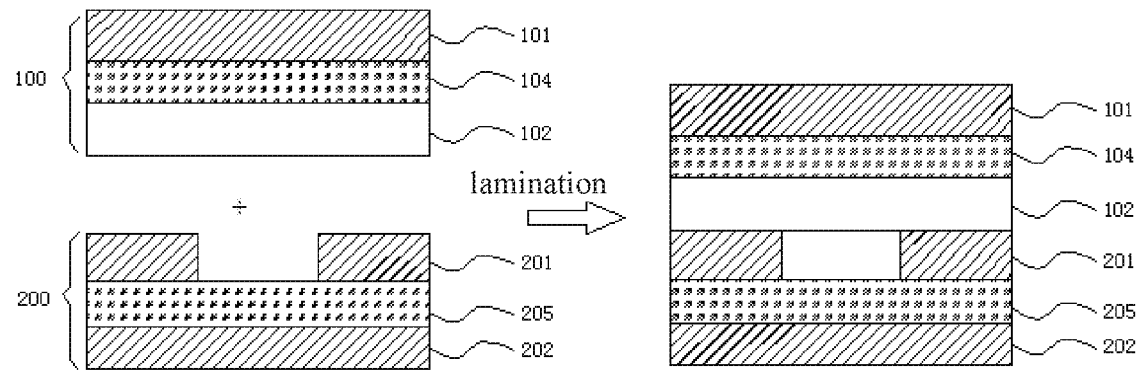
FIG. 8 is a structural view of embodiment 8 of the invention.

Implementation 8: As for the high-frequency and high-transmission speed FPC with the FRCC, the FRCC is laminated against the double-sided board, as shown in FIG. 8. The FRCC sequentially comprises, from top to bottom, the third copper foil layer 101, the second LCP resin layer 104 and the second ultra-low dielectric adhesive layer 102. The first insulating layer is a first LCP resin layer. The first copper foil layer 201, the first LCP resin layer 205 and the second copper foil layer 202 of the double-sided board are sequentially arranged from top to bottom.

Figure 9:
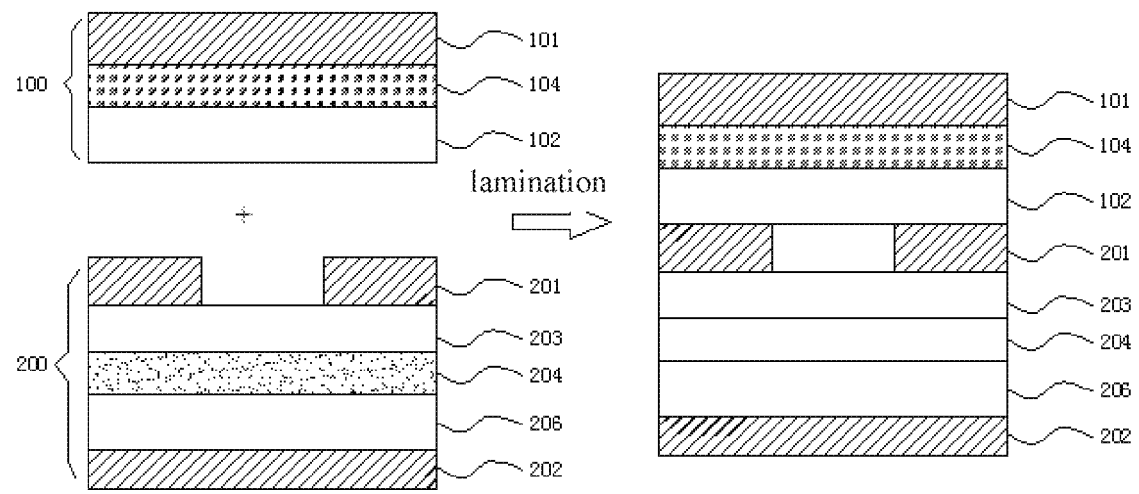
FIG. 9 is a structural view of embodiment 9 of the invention.

Implementation 9: As for the high-frequency and high-transmission speed FPC with the FRCC, the FRCC is laminated against the double-sided board, as shown in FIG. 9. The FRCC sequentially comprises, from top to bottom, the third copper foil layer 101, the second LCP resin layer and the second ultra-low dielectric adhesive layer 102. The double-sided board further comprises first ultra-low dielectric adhesive layers, which are respectively a first upper ultra-low dielectric adhesive layer and a first lower ultra-low dielectric adhesive layer. The first insulating layer is a first polyimide layer. The first copper foil layer 201, the first upper ultra-low dielectric adhesive layer 203, the first polyimide layer 204, the first lower ultra-low dielectric adhesive layer 206 and the second copper foil layer 202 of the double-sided board are sequentially arranged from top to bottom.

A preparation method of the high-frequency and high-transmission speed FPC with the FRCC in implementations 4-9 comprises the following step: the FRCC and the double-sided board are pre-pressed, laminated and cured, wherein the pre-pressing time is 10-30 s, the lamination time is 120-180 s, the lamination pressure is 90-110 kgf/cm², the lamination temperature is 185±10° C., the curing temperature is 165-175° C., and the curing time is 50-70 min.

Preferably, the lamination pressure is 100 kgf/cm2, the curing temperature is 170° C., and the curing time is 60 min.

Wherein, as for a preparation method of the double-sided board, the pre-pressing time is 10-30 s, the lamination time is 120-180 s, the lamination pressure is 90-110 kgf/cm², the lamination temperature is 185±10° C., the curing temperature is 165-175'C, and the curing time is 50-60 min.

Preferably, the lamination pressure is 100 kgf/cm2, the curing temperature is 170'C, and the curing time is 60 min.

Specific embodiments of implementations 1-3 of the invention are shown in Table 1 and Table 2 as follows.

TABLE 1

| Item | Film thickness (μm) | | | | Rz (μm) Third copper layer | Dk(10 GHz) | |
|---|---|---|---|---|---|---|---|
| | Third copper foil layer | Second upper ultra-low dielectric adhesive layer | Second polyimide layer or second LCP layer | Second lower ultra-low dielectric adhesive layer or second ultra-low dielectric adhesive layer | | Before soaking in water at the normal temperature | 24 h after soaking in water at the normal temperature |
| Embodiment 1 | 12 | 23 | 5 | 23 | 1 | 2.78 | 2.8 |
| Embodiment 2 | 18 | 20 | 12.5 | 20 | 0.6 | 2.91 | 2.97 |
| Embodiment 3 | 1 | 2 | 10 | 2 | 0.2 | 2.84 | 2.87 |
| Embodiment 4 | 20 | 50 | 50 | 50 | 0.8 | 2.95 | 2.97 |
| Embodiment 5 | 6 | * | 25 | 25 | 0.1 | 2.9 | 2.93 |
| Embodiment 6 | 12 | * | 50 | 25 | 0.4 | 2.98 | 3.01 |
| Embodiment 7 | 18 | * | 38 | 15 | 0.8 | 3.01 | 3.02 |
| Embodiment 8 | 35 | * | 50 | 25 | 1 | 3.05 | 3.07 |
| Embodiment 9 | 10 | * | 5 | 10 | 0.3 | 2.84 | 2.85 |
| Embodiment 10 | 15 | * | 100 | 45 | 0.5 | 2.88 | 2.89 |
| Comparative embodiment 1 | LCP substrate (50 um) | | | | | 3.1 | 3.13 |
| Comparative embodiment 2 | LCP substrate (100 um) | | | | | 3.11 | 3.13 |

| Item | Dk(10 GHz) Change rate (%) | Df(10 GHz) | | |
|---|---|---|---|---|
| | | Before soaking in water at the normal temperature | 24 h after soaking in water at the normal temperature | Change rate (%) |
| Embodiment 1 | 0.72 | 0.005 | 0.0051 | 2 |
| Embodiment 2 | 2.06 | 0.0068 | 0.0072 | 5.88 |
| Embodiment 3 | 1.06 | 0.0061 | 0.0063 | 3.28 |
| Embodiment 4 | 0.68 | 0.0062 | 0.0063 | 1.61 |
| Embodiment 5 | 1.03 | 0.0061 | 0.0064 | 4.91 |
| Embodiment 6 | 1.01 | 0.0071 | 0.0075 | 5.63 |
| Embodiment 7 | 0.33 | 0.0037 | 0.0038 | 2.7 |
| Embodiment 8 | 0.66 | 0.0038 | 0.0039 | 2.63 |
| Embodiment 9 | 0.35 | 0.0042 | 0.0043 | 2.38 |
| Embodiment 10 | 0.34 | 0.0057 | 0.0059 | 3.51 |
| Comparative embodiment 1 | 0.97 | 0.0025 | 0.0026 | 4 |
| Comparative embodiment 2 | 0.64 | 0.0026 | 0.0028 | 7.69 |

Comparison of the basic performance of the specific embodiments of implementations 1-3 of the invention with the basic performance of LCP boards in the prior art is shown in Table 2.

TABLE 2

| Item | Water absorption (%) | Peel strength (kgf/cm) | Bending test (times) | Rebound of the FPC not coated with a film (g) | Rebound of the FPC coated with a film (g) | Soldering resistance | Thermal expansion coefficient CTE (ppm/° C.) |
|---|---|---|---|---|---|---|---|
| Embodiment 1 | 0.2 | 1.58 | 2000 | 5.8 | 15.8 | 300° C.*10 s pass | 16 |
| Embodiment 2 | 0.25 | 1.45 | 1900 | 6.4 | 16.4 | 300° C.*10 s pass | 17 |
| Embodiment 3 | 0.12 | 1.26 | 1800 | 6.2 | 17.1 | 300° C.*10 s pass | 17 |
| Embodiment 4 | 0.16 | 1.31 | 1700 | 7.5 | 18.2 | 300° C.*10 s pass | 18 |
| Embodiment 5 | 0.15 | 1.62 | 2000 | 6.5 | 16.2 | 300° C.*10 s pass | 18 |
| Embodiment 6 | 0.18 | 1.64 | 1300 | 9.5 | 18.5 | 300° C.*10 s pass | 20 |
| Embodiment 7 | 0.08 | 1.38 | 1500 | 10.1 | 19.8 | 300° C.*10 s pass | 19 |
| Embodiment 8 | 0.06 | 1.55 | 1100 | 12.8 | 22.3 | 300° C.*10 s pass | 20 |
| Embodiment 9 | 0.08 | 1.56 | 1600 | 8.3 | 17.8 | 300° C.*10 s pass | 18 |
| Embodiment 10 | 0.06 | 0.98 | 1300 | 8.6 | 17.9 | 300° C.*10 s pass | 19 |
| Comparative embodiment 1 | 0.04 | 0.66 | 500 | 19.5 | 34.8 | 260° C.*10 s pass | 16 |
| Comparative embodiment 2 | 0.06 | 0.72 | 400 | 21.3 | 36.5 | 260° C.*10 s pass | 17 |

Note: 1, embodiments 1-4 are based on implementation 1; embodiments 5-6 are based on implementation 2; and embodiments 7-10 are based on implementation 3.

2. The performance indexes in Table 1 and Table 2 are tested in accordance with Item Test Criteria for FPC Assembly (TPCA-F-002).

From Table 2, the FRCC of the invention has excellent performance, and thus, the high-frequency and high-transmission speed FPC with the FRCC has an excellent high-speed transmission property, a low thermal expansion coefficient, stable Dk/Df performance in high-temperature and high-humidity environments, an ultra-low water absorption, a good UV laser drilling capacity, a low rebound suitable for high-density assembly, and an excellent mechanical property.

The FRCC of the invention is superior to LCP films and common PI-type bonding sheet and is suitable for wearable devices such as 5G smartphones and Apple Watch.

In implementations 4-9, the FPC is provided with three copper foil layers (the first copper foil layer, the second copper foil layer and the third copper foil layer) and is formed by the FRCC and the double-sided board laminated against each other, wherein the third copper foil layer is formed after the FRCC and the double-sided board are laminated against each other; as outer copper foil layers needing to be soldered at a high temperature (about 260° C.) and used to carry elements, the third copper foil layer and the second copper foil layer are required to have a high peel strength (over 0.7 kgf/cm); while as an inner copper foil layer located in the middle, the first copper foil layer also called a signal line copper foil layer and mainly used to close circuits does not need to be subjected to a SMT process or other high-temperature preparation processes and does not need to carry elements either, and thus the requirement for the peel strength of the first copper foil layer and the second ultra-low dielectric adhesive layer is low (just over 0.5 kgf/cm). The traditional view has always believed that it is better to keep the peel strength between copper foil layers and other layers in FPCs greater (at least over 0.7 kgf/cm) within a certain range so as to prevent the layers from being separated from one another or falling; to obtain a greater peel strength, the copper foil layers need to have a greater Rz value; however, under the skin effect generated in the signal transmission process of the copper foil layers, the Rz value is required to be smaller to realize a high frequency and high transmission speed, and thus, there is a contradiction between the requirement for the great peel strength and the requirement for the high frequency and high transmission speed. As for the FPC of the invention, due to the fact that the first copper foil layer does not need to be subjected to the SMT process or other high-temperature preparation processes and does not need to carry elements either, the requirement for the peel strength of the first copper foil layer and the second ultra-low dielectric electric adhesive layers is low and is only over 0.5 kgf/cm, and thus, the first copper foil layer can have a smaller Rz value, a better electrical property and a lower insertion loss without affecting the high-frequency and high-transmission speed performance of the FPC.

The above description is only used for explaining the embodiments of the invention, but not for limiting the protection scope of the invention. Any equivalent structures based on the contents of the specification and the drawings of the invention, or direct or indirect applications to other relevant technical fields should also fall within the patent protection scope of the invention.

What is claimed is:

1. A high-frequency and high-transmission speed flexible printed circuits (FPC), comprising a flexible resin coated copper (FRCC) and a double-sided board, wherein the FRCC and the double-sided board are laminated against each other;

the FRCC comprises a third copper foil layer, at least one second ultra-low dielectric adhesive layer and a second insulating layer located between the third copper foil layer and the at least one second ultra-low dielectric adhesive layer; the second insulating layer is at least one selected from the group consisting of a second polyimide layer and a second liquid crystal polymer (LCP) resin layer; a first surface of the third copper foil layer is an inner surface and is in contact with the second insulating layer or the at least one second ultra-low dielectric adhesive layer; the inner surface of the third copper foil layer has an Rz value of 0.1-1.0 μm;

the third copper foil layer, the at least one second ultra-low dielectric adhesive layer and the second insulating layer have a total thickness of 8-185 μm, wherein the third copper foil layer has a thickness of 1-35 μm, the at least one second ultra-low dielectric adhesive layer has a thickness of 2-50 μm, the second polyimide layer has a thickness of 5-50 μm, and the second LCP resin layer has a thickness of 5-100 μm;

the at least one second ultra-low dielectric adhesive layer has a Dk value of 2.0-3.5 and a Df value of 0.002-0.010; the double-sided board comprises a first copper foil layer, a second copper foil layer and a first insulating layer located between the first copper foil layer and the second copper foil layer; a second surface, close to the first insulating layer, of the first copper foil layer is an inner surface; a third surface, close to the first insulating layer, of the second copper foil layer is an inner surface; the inner surface of the first copper foil layer has an Rz value of 0.05-0.5 μm; and the inner surface of the second copper foil layer has an Rz value of 0.1-1.10 μm;

wherein the at least one second ultra-low dielectric adhesive layer is a thermoset polyimide layer containing polyimide, and a content of the polyimide accounts for 40-95% of a total solid content of the at least one second ultra-low dielectric adhesive layer.

2. The high-frequency and high-transmission speed FPC with the FRCC according to claim 1, wherein a laminated structure formed by the third copper foil layer, the at least one second ultra-low dielectric adhesive layer and the second insulating layer has an overall water absorption of 0.01-1.5%.

3. The high-frequency and high-transmission speed FPC with the FRCC according to claim 1, wherein the third copper foil layer, the first copper foil layer and the second copper foil layer are all rolled copper foil layers or electrolytic copper foil layers.

4. The high-frequency and high-transmission speed FPC with the FRCC according to claim 1, wherein the second LCP resin layer has a Dk value of 2.0-3.5 and a Df value of 0.002-0.005.

5. The high-frequency and high-transmission speed FPC with the FRCC according to claim 1, wherein a peel strength between the at least one second ultra-low dielectric adhesive layer and the third copper foil layer and a peel strength between the second at least one ultra-low dielectric adhesive layer and the second insulating layer are both over 0.7 kgf/cm.

6. The high-frequency and high-transmission speed FPC with the FRCC according to claim 1, wherein a resin material of the at least one second ultra-low dielectric adhesive layer is at least one selected from the group consisting of fluororesin, epoxy resin, acrylic resin, carbamate resin, silicone resin, poly-p-xylene resin, bismaleimide resin and polyimide resin.

7. The high-frequency and high-transmission speed FPC with the FRCC according to claim 1, wherein the FRCC adopts one structure selected from the group consisting structure 1: wherein, the second insulating layer is a second polyimide layer, two of the second ultra-low dielectric adhesive layer are included and are respectively a second upper ultra-low dielectric adhesive layer and a second lower ultra-low dielectric adhesive layer, the second polyimide layer is located on an upper surface of the at least one second lower ultra-low dielectric adhesive layer, the second upper ultra-low dielectric adhesive layer is located on an upper surface of the second polyimide layer, and the third copper foil layer is located on an upper surface of the second upper ultra-low dielectric adhesive layer; the third copper foil layer, the second upper ultra-low dielectric adhesive layer, the second polyimide layer and the second lower ultra-low dielectric adhesive layer have a total thickness of 10-185 μm;

structure 2: wherein, the second insulating layer is a second polyimide layer located on an upper surface of the at least one second ultra-low dielectric adhesive layer, the third copper foil layer is located on an upper surface of the second polyimide layer, and the third copper foil layer, the second polyimide layer and the at least one second ultra-low dielectric adhesive layer have a total thickness of 8-135 μm; and structure 3: wherein, the second insulating layer is a second LCP resin layer, the third copper foil layer is located on an upper surface of the second LCP resin layer, and the at least one second ultra-low dielectric adhesive layer is located on a lower surface of the second LCP resin layer.

8. The high-frequency and high-transmission speed FPC with the FRCC according to claim 7, wherein the FPC adopts one structure selected from the group consisting of the following six structures with the FRCC laminated against the double-sided board:

structure 4: wherein, the FRCC sequentially comprises, from top to bottom, the third copper foil layer, the second upper ultra-low dielectric adhesive layer, the second polyimide layer and the second lower ultra-low dielectric adhesive layer; the double-sided board further comprises first ultra-low dielectric adhesive layers, which are respectively a first upper ultra-low dielectric adhesive layer and a first lower ultra-low dielectric adhesive layer; the first insulating layer is a first polyimide layer; and the first copper foil layer, the first upper ultra-low dielectric adhesive layer, the first polyimide layer, the first lower ultra-low dielectric adhesive layer and the second copper foil layer of the two-sided board are sequentially arranged from top to bottom, where structure 4 further modifies structure 1;

structure 5: wherein, the FRCC sequentially comprises, from top to bottom, the third copper foil layer, the second upper ultra-low dielectric adhesive layer, the second polyimide layer and the second lower ultra-low dielectric adhesive layer; the first insulating layer is a first LCP resin layer; and the first copper foil layer, the first LCP resin layer and the second copper foil layer of the double-sided board are sequentially arranged from top to bottom, where structure 5 further modifies structure 1;

structure 6: wherein, the FRCC sequentially comprises, from top to bottom, the third copper foil layer, the second polyimide layer and the at least one second ultra-low dielectric adhesive layer; the double-sided board further comprises first ultra-low dielectric adhesive layers, which are respectively a first upper ultra-low dielectric adhesive layer and a first lower ultra-low dielectric adhesive layer; the first insulating layer is a first polyimide layer; and the first copper foil layer, the first upper ultra-low dielectric adhesive layer, the first polyimide layer, the first lower ultra-low dielectric adhesive layer and the second copper foil layer of the double-sided board are sequentially arranged from top to bottom;

structure 7: wherein, the FRCC sequentially comprises, from top to bottom, the third copper foil layer, the second polyimide layer and the at least one second ultra-low dielectric adhesive layer; the first insulating layer is a first LCP resin layer; and the first copper foil layer, the first LCP resin layer and the second copper foil layer of the double-sided board are sequentially arranged from top to bottom;

structure 8: wherein, the FRCC sequentially comprises, from top to bottom, the third copper foil layer, the second LCP resin layer and the at least one second ultra-low dielectric adhesive layer; the first insulating layer is a first LCP resin layer; and the first copper foil layer, the first LCP resin layer and the second copper foil layer of the double-sided board are sequentially arranged from top to bottom; and structure 9: wherein, the FRCC sequentially comprises, from top to bottom, the third copper foil layer, the second LCP resin layer and the at least one second ultra-low dielectric adhesive layer; the double-sided board further comprises first ultra-low dielectric adhesive layers, which are respectively a first upper ultra-low dielectric adhesive layer and a first lower ultra-low dielectric adhesive layer; the first insulating layer is a first polyimide layer; and the first copper foil layer, the first upper ultra-low dielectric adhesive layer, the first polyimide layer, the first lower ultra-low dielectric adhesive layer and the second copper foil layer of the double-sided board are sequentially arranged from top to bottom.

9. A preparation method of the high-frequency and high-transmission speed FPC with the FRCC according to claim 8, wherein the preparation method comprises the step of pre-pressing, lamination and curing the FRCC and the double-sided board, wherein a pre-pressing time is 10-30 s, a lamination time is 120-180 s, a lamination pressure is 90-110 kgf/cm$^2$, a lamination temperature is 185±10° C., a curing temperature is 165-175° C., and a curing time is 50-60 min.

* * * * *